United States Patent
Monroe et al.

(10) Patent No.: US 7,340,228 B2
(45) Date of Patent: Mar. 4, 2008

(54) APPARATUS AND METHOD FOR HIGH EFFICIENCY RF POWER AMPLIFICATION USING DRAIN BIAS ADAPTATION

(75) Inventors: Robert W. Monroe, Melissa, TX (US); Michael L. Brobston, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 396 days.

(21) Appl. No.: 11/177,032

(22) Filed: Jul. 8, 2005

(65) Prior Publication Data

US 2007/0010218 A1    Jan. 11, 2007

(51) Int. Cl.
*H04B 1/04* (2006.01)

(52) U.S. Cl. .............. 455/127.1; 330/129; 330/285

(58) Field of Classification Search .......... 455/127.1, 455/127.2, 69, 522, 572; 375/297; 330/127, 330/129, 135, 250, 285, 296
See application file for complete search history.

(56) References Cited

U.S. PATENT DOCUMENTS

| | | | | |
|---|---|---|---|---|
| 5,745,857 A | * | 4/1998 | Maeng et al. ............ | 455/127.1 |
| 6,122,491 A | * | 9/2000 | Francisco ................ | 455/127.2 |
| 6,492,872 B1 | * | 12/2002 | Fujioka et al. ............ | 330/285 |
| 6,678,507 B1 | * | 1/2004 | Kurokawa et al. ........ | 455/127.1 |
| 6,681,101 B1 | * | 1/2004 | Eidson et al. ............ | 455/127.1 |
| 7,250,817 B2 | * | 7/2007 | Salvi ......................... | 330/129 |

* cited by examiner

*Primary Examiner*—Quochien B. Vuong (57) ABSTRACT

An RF transmitter having an RF power amplifier comprising: 1) a drive transistor that receives an input RF signal and generates an output RF signal; and 2) a drain bias adaptation circuit for supplying drain current to the drive transistor. The drain bias adaptation circuit comprises: i) a first switch for coupling the drive transistor drain to a system supply voltage; ii) a second switch for coupling the drive transistor drain to a high supply voltage that is greater than the system supply voltage; iii) a first bypass capacitor coupled to the first switch for reducing noise in the drain current when the first switch is closed and the second switch is open; and iv) a second bypass capacitor coupled to the second switch for reducing noise in the drain current when the second switch is closed and the first switch is open.

20 Claims, 5 Drawing Sheets

APPARATUS AND METHOD FOR HIGH EFFICIENCY RF POWER AMPLIFICATION USING DRAIN BIAS ADAPTATION

TECHNICAL FIELD OF THE INVENTION

The present invention relates generally to radio frequency (RF) power amplifiers and, more specifically, to an apparatus for improving the efficiency of an RF power amplifier using drain bias adaptation.

BACKGROUND OF THE INVENTION

Power dissipation and power efficiency are important operating characteristics of the radio frequency (RF) power amplifier of any RF transmitter. The more efficient the RF power amplifier is, the less expensive the transmitter is to operate, and the cooler and more reliably it runs. Since wireless communication systems of various types have become ubiquitous in society, it is important to maximize the efficiency of RF power amplifiers.

Unfortunately, much of the efficiency of a conventional RF power amplifier is lost due to the set drain voltage, which is constant regardless of signal level. It is known that for Class-AB amplifiers that drain efficiency rolls off with the square root of output power. This results in a severe efficiency penalty when processing signals with low average power and large peak-to-average power variation, such as CDMA, WCDMA or OFDMA signals.

For example, in normal operation (e.g., >99% of the time), the average CDMA or WCDMA signal power is low and the RF transmitter exhibits very low efficiency due to the high drain voltage of the RF power amplifier. The efficiency percentage is given by Equation 1 below:

$$\text{Efficiency}(\%) = 100 * (P_{OUT}/(V_{DRAIN} * I_{DRAIN})). \quad [\text{Eqn. 1}]$$

However, during large signal peaks (e.g., <1% of the time), the power amplifier operates very efficiently due to the large output power ($P_{OUT}$ in Equation 1). Unfortunately, this only occurs for a small fraction of the time. Using a fixed drain voltage, the level of the drain voltage must be set high enough to allow the envelope peaks to be amplified with minimal distortion. This means the drain bias voltage is set at an unnecessarily high level for most (>99%) of the signal envelope period, so that overall drain efficiency is very low.

Figure 1:
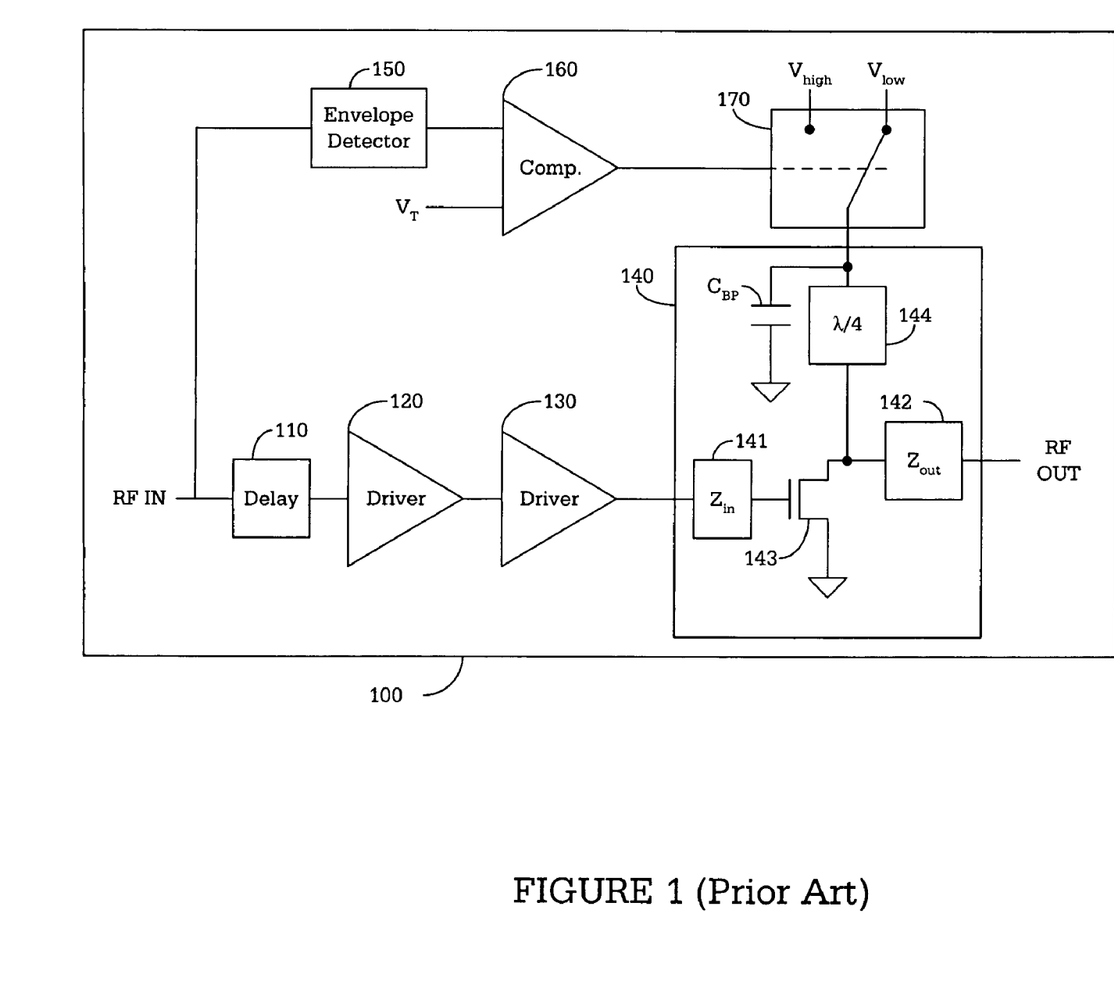
FIG. 1 is a schematic diagram illustrating a representative embodiment of a conventional RF transmitter using drain bias adaptation (or drain supply modulation) according to the principles of the prior art.

Many different techniques for high efficiency RF and microwave amplifiers exist or have been proposed. These techniques include drain bias adaptation (or drain supply modulation) techniques. FIG. 1 is a schematic diagram illustrating selected portions of conventional RF transmitter 100, which uses drain bias adaptation (or drain supply modulation) according to the principles of the prior art. RF transmitter 100 comprises delay element 110, drivers 120 and 130, RF power amplifier 140, envelope detector 150, comparator 160, and switch 170. RF power amplifier 140 comprises input impedance ($Z_{in}$) matching circuit 141, output impedance ($Z_{out}$) matching circuit 142, laterally diffused metal-oxide-semiconductor field effect transistor (LDMOS) 143, quarter-wavelength (λ/4) drain feed 144 and bypass capacitor ($C_{BP}$).

In FIG. 1, it is assumed that up-conversion circuitry (not shown) has already up-converted a baseband signal to an RF level to generate the input signal, RF IN. Envelope detector 150 compares the voltage envelope of RF IN to a predetermined threshold voltage, $V_T$. When the RF IN signal is below the level of $V_T$, comparator 160 generates an output control signal that causes switch 170 to select the low supply voltage, $V_{low}$, which is thereby applied to RF power amplifier 140. When the RF IN signal is above the level of $V_T$, comparator 160 generates an output control signal that causes switch 170 to select the high supply voltage, $V_{high}$, which is thereby applied to RF power amplifier 140. Thus, when the RF IN signal is small, RF power amplifier 140 operates efficiently due to the low drain supply voltage. When the RF IN signal is large, RF power amplifier 140 operates from the high supply voltage, also with high power efficiency due to the large output power being processed (see Equation 1).

In the RF transmit path, delay element 110 delays the RF IN signal to compensate for the processing time of envelope detector 150, comparator 160 and switch 170. Drivers 120 and 130 boost the power of the RF IN signal to a suitable level to drive RF power amplifier 140. LDMOS 143 is the power amplification transistor that drives the antenna (not shown) at RF OUT. The drain of LDMOS 143 pulls drain current from either the low supply voltage, $V_{low}$, or the high supply voltage, $V_{high}$, through quarter-wavelength (λ/4) drain feed 144. Low-frequency modulation and noise are shorted to ground after the quarter-wavelength (λ/4) drain feed 144 by bypass capacitor $C_{BP}$.

A high efficiency system in which the drain voltage supplied to a MESFET amplifier is switched between a +7 volt supply and a linearly variable 7-12 volt supply according to variations in envelope voltage is disclosed in "Microwave Power Amplifier With 'Envelope Controlled' Drain Power Supply,", C. Buoli et al., 25th European Microwave Conf., September 1995, pp. 31-35. This system formed the basis for the patent "Linear Microwave Power Amplifier with Supply Power Injection Controlled by the Modulation Envelope," World Intellectual Property Organization, International Publication No. WO 95/34128. However, the patent only covers switching between two fixed voltages, namely, +VA and +VB.

The same technique is described in "Microwave Power Amplifier Efficiency Improvement with a 10 MHz HBT DC-DC Converter", G. Hannington et al., IEEE MTT-S Tech. Dig., 1998, pp. 589-592. Hannington uses a DC-DC converter to dynamically modify the RF amplifier drain voltage according to the time-varying envelope of a CDMA signal. The result is even greater efficiency due to the use of a high-efficiency switching regulator, as opposed to the linear regulated modulator disclosed by Bouli et al.

U.S. Pat. No. 6,492,867 to Bar-David, entitled "Method and Apparatus for Improving the Efficiency of Power Amplifiers Operating Under a Large Peak-To-Average Ratio" describes a system nearly identical to the Bouli patent, with the minor exceptions of a feedback loop for controlling the exact drain voltage and an automatic gain control amplifier for compensating the change in amplifier gain during the period when the drain receives the higher voltage.

However, these prior art RF power amplifier schemes all suffer from one or more drawbacks. The prior art amplifiers do not disclose a mechanism for discharging the large RF amplifier drain bypass capacitance. In all practical RF amplifiers, it is necessary to place low-frequency bypass capacitors between the RF power transistor drain and ground in order to prevent the low-frequency modulation and noise from interacting with the bias circuitry, thereby degrading adjacent channel power ratio (ACPR), intermodulation distortion (IMD), and associated memory effects (unsymmetrical ACPR/IMD). However, the prior art references do not disclose a method for quickly charging and discharging the bypass capacitance back to the previous voltage level.

Gain compensation during the period of high drain voltage also is an issue. The Buoli patent (International Publication No. WO 95/34128) does not mention a method of gain compensation. In the Bar-David patent (U.S. Pat. No. 6,492,867), a method of gain compensation during the period of high drain voltage is accomplished using an automatic gain control (AGC) amplifier. However, in commercial RF AGC amplifiers, the full-scale response time can be >500 nanoseconds or more, according to published data sheets (e.g., ADL5330).

Such a response time is too slow to compensate for the amplifier gain change during the pulsing period, which is only 10 to 100 nanoseconds, depending on modulation bandwidth. The exact timing required to compensate the amplifier gain change has a margin of error in the low nanosecond range, which is extremely difficult to realize using analog methods. The exact gain setting required for compensation is also difficult to meet due to the gain tolerance in AGC amplifiers.

Delay compensation of the drain modulation circuit also is a problem in the prior art RF power amplifiers. U.S. Pat. No. 6,492,867 makes no mention of a delay line. In International Publication No. WO 95/34128, an RF delay line is used to compensate for the delay of the drain modulation circuitry. However, practical RF delay lines are usually bulky coax cables, expensive filters, or extremely high loss integrated delay lines.

Therefore, there is a need in the art for an improved RF power amplifier using drain bias adaptation that overcomes the above-described shortcomings of the prior art. In particular, there is a need for a method of low-frequency bypass capacitor charging and discharging in an RF power amplifier using drain bias adaptation. There is a still further need for an RF power amplifier that more perfectly compensates the gain change during the period of high drain voltage. Finally, there is a need for an RF power amplifier using drain bias adaptation that implements a delay element that minimizes loss and is small and inexpensive.

SUMMARY OF THE INVENTION

The invention described herein seeks to improve RF power amplifier efficiency by decreasing the drain voltage during times of low signal power (>99% of the time) and quickly boosting the drain voltage during peaks in the signal (<1% of the time).

To address the above-discussed deficiencies of the prior art, it is a primary object of the present invention to provide a radio frequency (RF) transmitter comprising: 1) a radio-frequency (RF) power amplifier comprising a drive transistor capable of being coupled to an antenna, wherein the RF power amplifier is capable of receiving an input RF signal and generating an output RF signal for driving the antenna; and 2) a drain bias adaptation circuit for supplying drain current to a drain of the drive transistor. According to an advantageous embodiment of the present invention, the drain bias adaptation circuit comprises: i) a first switch comprising a first terminal coupled to the drive transistor drain and a second terminal coupled to a system supply voltage having a level $V_{system}$; ii) a second switch comprising a first terminal coupled to the drive transistor drain and a second terminal coupled to a high supply voltage having a level $V_{high}$ greater than $V_{system}$; iii) a first bypass capacitor coupled to the second terminal of the first switch for reducing low-frequency signal components in the drain current when the first switch is closed and the second switch is open; and iv) a second bypass capacitor coupled to the second terminal of the second switch for reducing low-frequency signal components in the drain current when the second switch is closed and the first switch is open.

According to one embodiment of the present invention, the RF transmitter further comprises a control circuit for opening and closing the first and second switches, wherein the control circuit closes the first switch and opens the second switch when a detected power level, $P_D$, of a transmitter baseband signal is greater than a maximum threshold value.

According to another embodiment of the present invention, the control circuit opens the first switch and closes the second switch when the transmitter baseband signal is not greater than the maximum threshold value.

According to still another embodiment of the present invention, the control circuit comprises a power detector capable of receiving digital in-phase (I) data samples and digital quadrature (Q) data samples associated with the transmitter baseband signal and calculating the detected power level, $P_D$, according to $P_D=(I^2+Q^2)^{1/2}$.

According to yet another embodiment of the present invention, the control circuit further comprises a comparator capable of comparing the detected power level, $P_D$, to the maximum threshold value and generating a first control pulse when the detected power level, $P_D$, exceeds the maximum threshold value.

According to a further embodiment of the present invention, the control circuit further comprises a pulse stretching circuit capable of receiving the first control pulse and generating a stretched control pulse having a minimum predetermined width.

According to a still further embodiment of the present invention, the control circuit further comprises a switch timing control circuit capable of receiving the stretched control pulse and generating a first switch control signal that opens the first switch and a second switch control signal that closes the second switch after the first switch is opened by the first switch control signal.

According to a yet further embodiment of the present invention, the switch timing control circuit is further capable of generating a third switch control signal that opens the second switch and a fourth switch control signal that closes the first switch after the second switch is opened by the third switch control signal.

In one embodiment of the present invention, the control circuit further comprises a gain compensation circuit capable of multiplying the transmitter baseband signal by a gain factor to thereby generate a modified baseband signal that is capable of being upconverted to produce the input RF signal to the RF power amplifier, wherein the gain factor has a first gain value when the detected power level, $P_D$, of the transmitter baseband signal is greater than the maximum threshold value and has a second gain value when the detected power level, $P_D$, of the transmitter baseband signal is not greater than the maximum threshold value.

In another embodiment of the present invention, the control circuit further comprises a transmit path delay circuit for delaying the modified baseband signal prior to upconverting in order to compensate for time delays associated with the generation of the first, second, third and fourth switch control signals.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 5 and the various embodiments used to describe the principles of the present invention in this patent document are by way of illustration only and should not be construed in any way to limit the scope of the invention. Those skilled in the art will understand that the principles of the present invention may be implemented in any suitably arranged radio frequency (RF) power amplifier.

Figure 2:
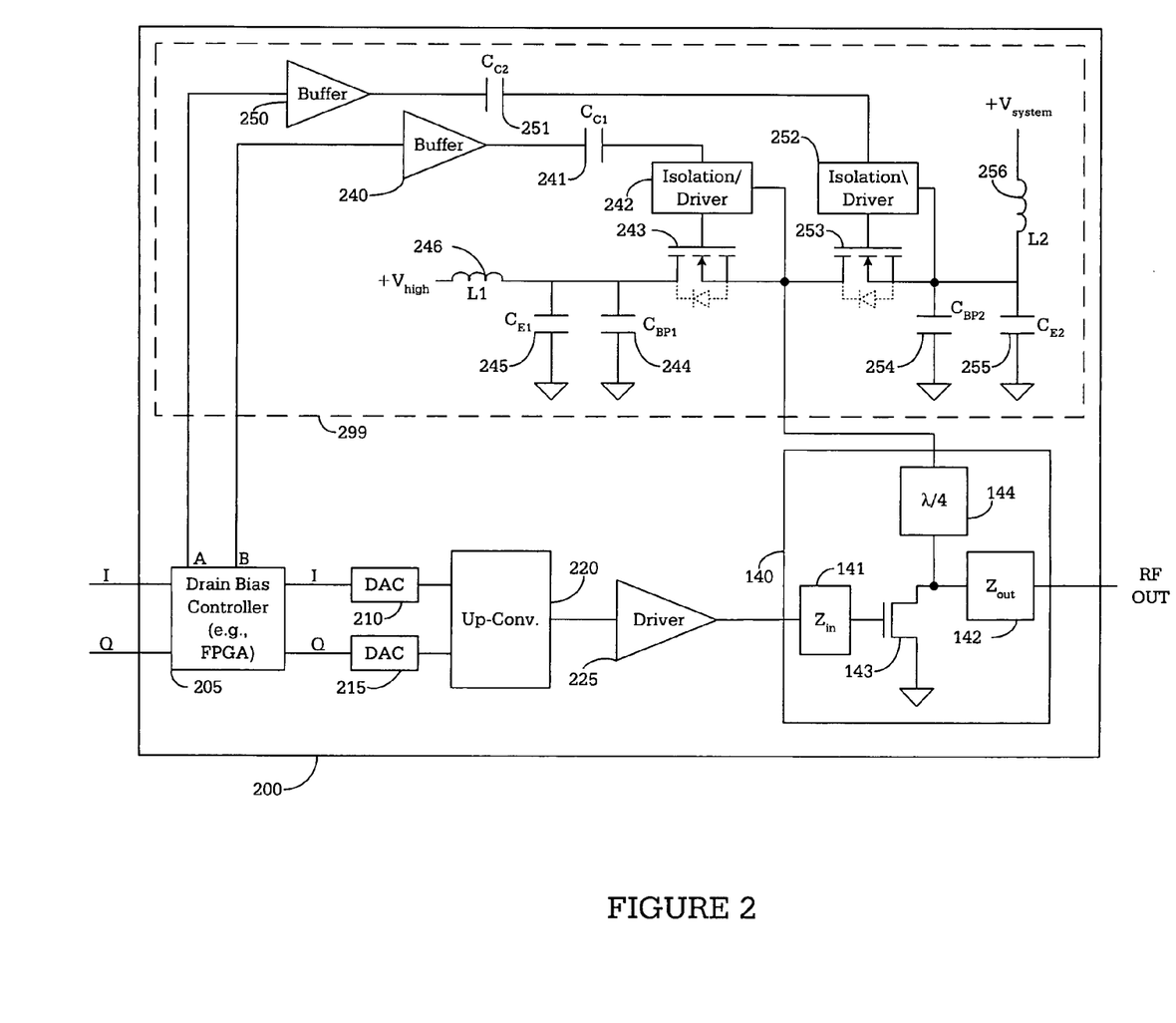
FIG. 2 is a schematic diagram illustrating one embodiment of an improved RF transmitter using drain bias adaptation (or drain supply modulation) according to the principles of the present invention.

FIG. 2 is a schematic diagram illustrating one embodiment of improved RF transmitter 200, which uses drain bias adaptation (or drain supply modulation) according to the principles of the present invention. In one embodiment, RF transmitter 200 may be implemented in a base station of an OFDMA, CDMA or WCDMA wireless network. In an alternate embodiment, RF transmitter 200 may be implemented in a wireless terminal (e.g., cell phone or similar wireless device) capable of accessing an OFDMA, CDMA or WCDMA wireless network.

RF transmitter 200 comprises drain bias controller 205, digital-to-analog converter (DAC) 210, digital-to-analog converter (DAC) 215, up-converter 220, driver 225, RF power amplifier 140, and drain bias adaptation (DBA) circuit 299 (indicated by a dotted line). DBA circuit 299 comprises buffer 240, coupling capacitor 241 ($C_{C1}$), isolation and gate drive circuitry 242, MOSFET 243, bypass capacitor 244 ($C_{BP1}$), energy capacitor 245 ($C_{E1}$), and inductor 246 (L1). DBA circuit 299 further comprises buffer 250, coupling capacitor 251 ($C_{C2}$), isolation and gate drive circuitry 252, MOSFET 253, bypass capacitor 254 ($C_{BP2}$), storage capacitor 255 ($C_{E2}$), and inductor 256 (L2). As will be explained below in greater detail, MOSFET 243 and MOSFET 253 operate as switches.

As in prior art FIG. 1, RF power amplifier 140 comprises input impedance ($Z_{in}$) matching circuit 141, output impedance ($Z_{out}$) matching circuit 142, LDMOS transistor 143, quarter-wavelength ($\lambda/4$) drain feed 144, but no longer contains bypass capacitor $C_{BP}$. Bypass capacitor $C_{BP}$ has been moved into DBA circuit 299.

Figure 3:
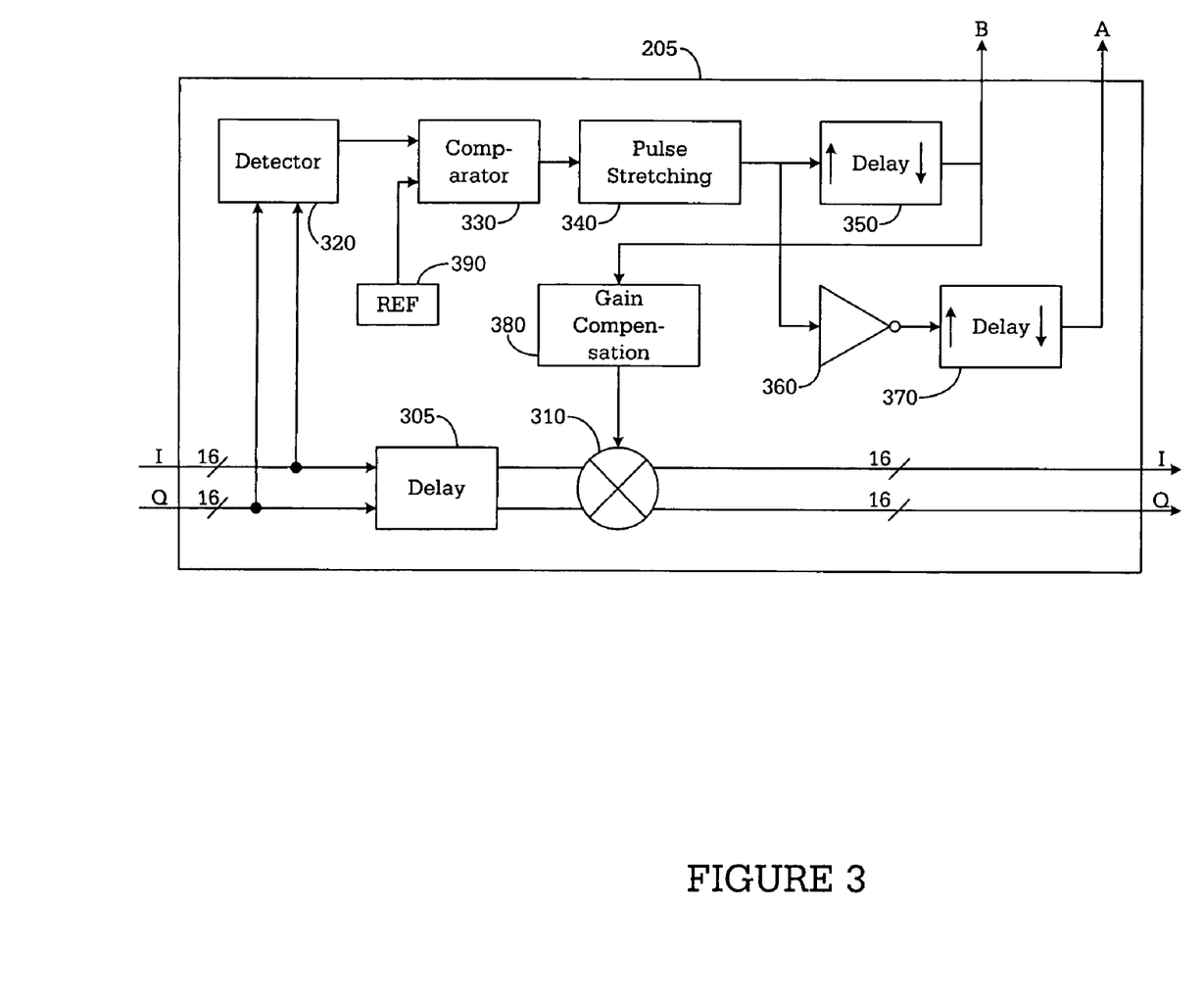
FIG. 3 is a schematic diagram illustrating the drain bias controller in FIG. 2 in greater detail according to an exemplary embodiment of the present invention.

FIG. 3 is a schematic diagram illustrating drain bias controller 205 in greater detail according to an exemplary embodiment of the present invention. In an advantageous embodiment, drain bias controller 205 may be implemented as a field programmable gate array (FPGA). Drain bias controller 205 comprises delay element 305, multiplier 310, power detector 320, comparator 330, pulse stretching circuit 340, delay element 350, inverter 360, delay element 370, gain compensation circuit 380, and reference 390.

In an exemplary embodiment, modulated baseband data is de-serialized and sent to drain bias controller 205 as 16-bit in-phase (I) data samples and 16-bit quadrature (Q) data samples. In other embodiments, data samples of greater than 16 bits or less than 16 bits may be used. Within drain bias controller 205, delay element 305 delays the I and Q signals entering the transmit path relative to the signals going to drain bias adaptation (DBA) circuitry 299 in FIG. 2. The transmit path of transmitter 200 includes multiplier 310 in FIG. 3 and DAC 210, DAC 215, up-converter 220, driver 225, and RF power amplifier 140 in FIG. 2.

The received I and Q data samples are delayed by delay element 305 in drain bias controller 205. Multiplier 310 then multiplies the delayed I and Q samples from delay element 305 by a factor determined by gain compensation circuit 380 (FIG. 2). DAC 210 and DAC 215 convert the digital I and Q outputs of multiplier 310 to analog I and Q signals. Up-converter 220 then combines and up-converts the analog I and Q signals to generate an RF signal. Driver 225 amplifies the RF signal to a suitable level to drive RF power amplifier 140. RF power amplifier 140 then amplifies the RF signal to a suitable level for transmission.

Power detector 320 also receives the incoming digital I and Q data samples and determines (or detects) the magnitude of the digital power level, $P_D$, according to the formula:

$$P_D = \sqrt{I^2 + Q^2} \qquad [\text{Eqn. 2}]$$

Comparator 330 then compares the magnitude of the power level at the output of power detector 320 to the predetermined reference (or threshold) level 390 and outputs a high voltage (Logic 1) if the output of power detector 320 exceeds the reference. When the power level at the output of power detector 320 falls below the reference level 390, comparator 330 outputs a low voltage (Logic 0). Thus, the brief periods when the power level of the I and Q data samples spike higher than the threshold level cause positive pulses at the output of comparator 330.

Pulse stretching circuit 340 stretches the minimum pulse-width of the output of comparator 330 to, for example, 25 nanoseconds to guarantee MOSFET turn-on for extremely short duration pulses (which otherwise would not fully turn the MOSFETs on). The stretched pulse is applied to the input of delay element 350 and inverter 360.

Delay element 350 provides an adjustable time delay that allows the rising or falling edge of output B to become delayed relative to the falling or rising edge of the inverted pulse at output A. Similarly, delay element 370 provides an adjustable time delay that allows the falling or rising edge at output A to be delayed relative to the rising or falling edge at output B. This flexibility in the exact timing of signals A and B is necessary to facilitate more precise control of the currents passing through MOSFETs 243 and 253 and into the amplifier 140. An example timing relationship is shown in FIG. 4.

Figure 4:
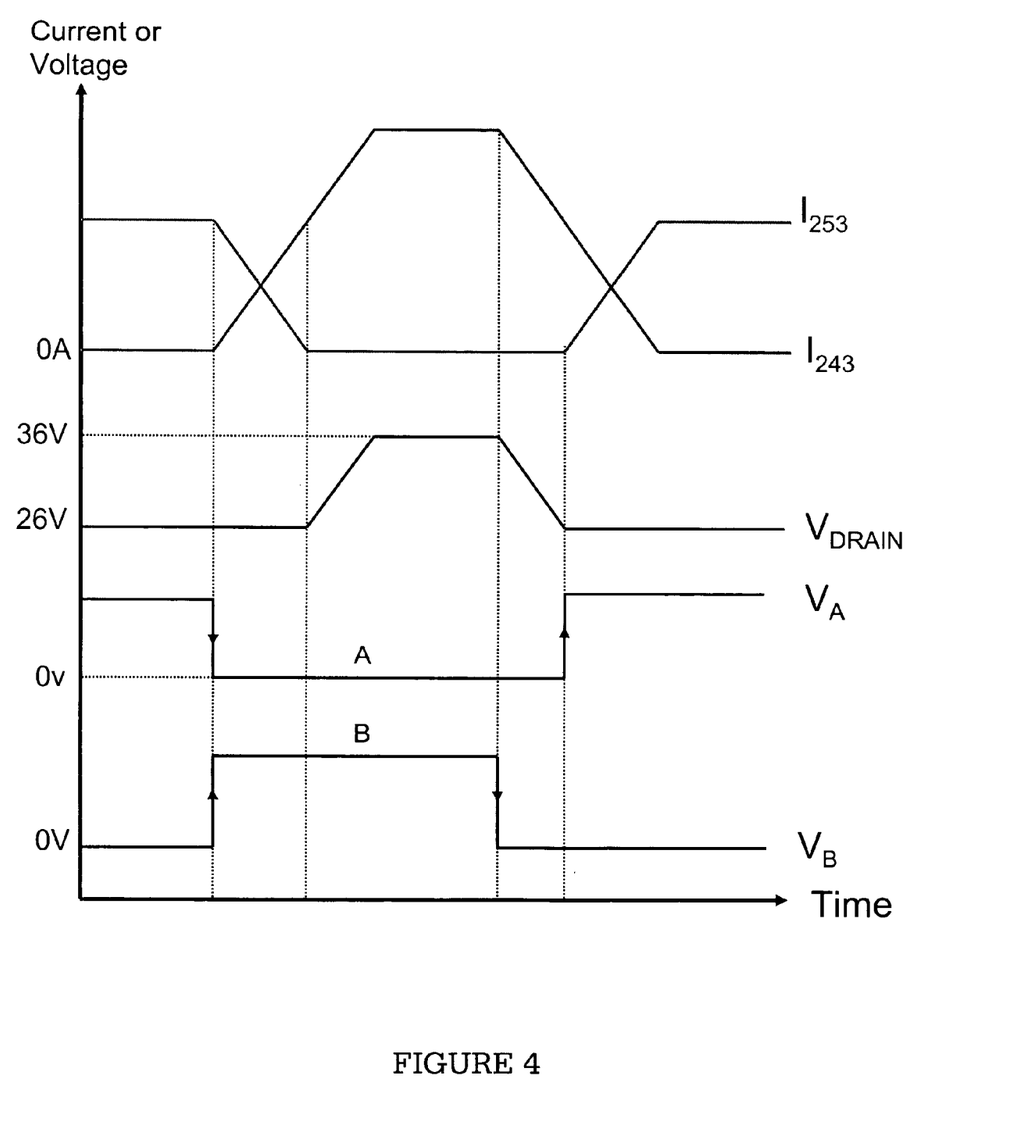
FIG. 4 is a timing diagram of control signals generated by the drain bias controller in FIG. 2 in relation to the ideal MOSFET and load currents.

As FIG. 4 shows, output B of drain bias controller 205 is a normally low control signal that pulses high when the I and Q data samples exceed the predetermined threshold power level. Correspondingly, output A of drain bias controller 205 is a normally high control signal that pulses low when the I and Q data samples exceed the threshold power level. During normal conditions, when the I and Q samples are less than the threshold level, output B is low, which turns MOSFET 243 off, and output A is high, which turns MOSFET 253 on.

Output A of drain bias controller 205 (FIG. 3) is applied to the input of analog buffer 250 (FIG. 2) in order to increase current driving capability. The output of buffer 250 passes through coupling capacitor 251 and isolation and gate drive circuit 252 to enable fast high-side switching of N-channel MOSFET 253. Output B of drain bias controller 205 is applied to the input of buffer 240 in order to increase current driving capability. The output of buffer 240 passes through coupling capacitor 241 and isolation and gate drive circuit 242 to enable fast high-side switching of N-channel MOSFET 243. The end result is MOSFET 243 turns on and off very quickly in a manner similar to MOSFET 253.

MOSFET 253 is normally on and provides the system voltage, $V_{SYSTEM}$, to RF power amplifier 140 and presents a very low impedance to the normal DC current flow to RF power amplifier 140. By moving bypass capacitor 254 from RF power amplifier 140 to the supply side of MOSFET 253, a low impedance will exist to any unwanted low frequency modulation coming from the drain feed of RF power amplifier 140.

When the I and Q data samples are greater than the threshold, the negative-going pulse at output A briefly turns MOSFET 253 off and, at the same time, the positive-going pulse at output B momentarily turns MOSFET 243 on. When MOSFET 243 turns on and MOSFET 253 turns off, voltage from supply $V_{HIGH}$ and storage capacitor 245 ($C_{E1}$) is applied to the drain feed of RF power amplifier 140 to quickly boost the voltage above the system voltage, $V_{SYSTEM}$. During the boosting period, bypass capacitor 244 ($C_{BP1}$) provides a low impedance to any low frequency modulation present at the drain feed of RF power amplifier 140.

When the I and Q data samples are less than the threshold, a negative-going pulse at output B begins to turn MOSFET 243 off and, at nearly the same time, the positive-going pulse at output B begins to turn MOSFET 253 on. When MOSFET 253 turns fully on, it presents an extremely low impedance to the drain feed of RF power amplifier 140 and any residual high voltage leftover from the pulsing period quickly discharges through MOSFET 253 and is absorbed in the capacitor $C_{E2}$.

Figure 5A:
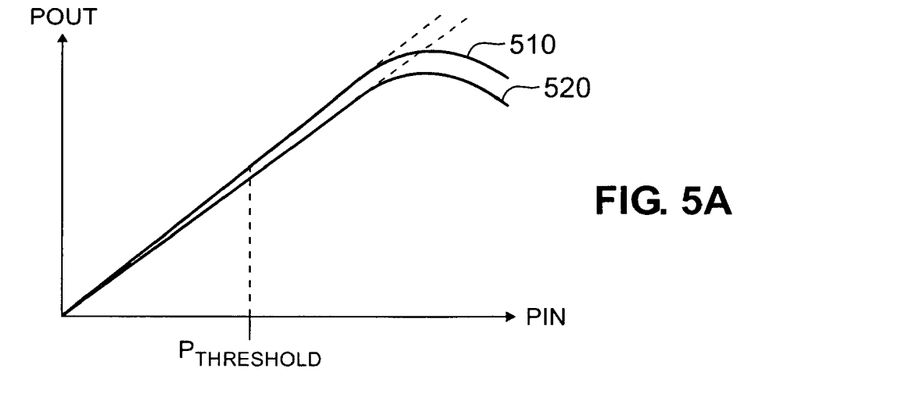
FIGS. 5A, 5B and 5C illustrate the AM-AM transfer function discontinuity caused by drain voltage switching.

As noted previously, gain compensation during the period of high drain voltage is a problem in the prior art. In FIG. 5A, curve 510 illustrates the transfer function of output power, POUT, versus input power, PIN, for a drain voltage of, for example, +36 volts. Curve 520 illustrates the transfer function for a drain voltage of, for example, +26 volts.

Figure 5B:
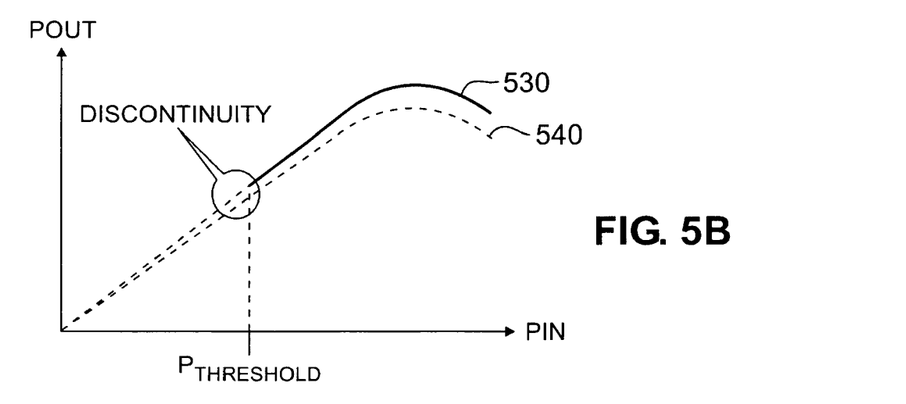
Figure 5C:
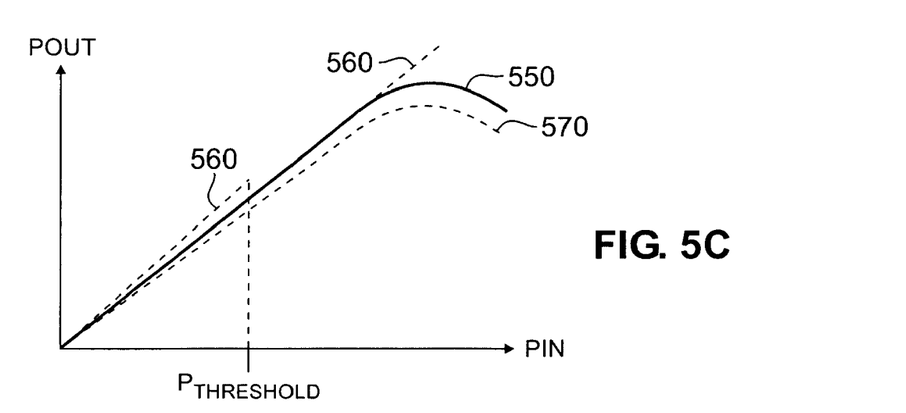

In FIG. 5B, curve 530 illustrates the composite AM-AM transfer function that results from switching between the two supply voltages according to the principles of the present invention. At the threshold power level, $P_{Threshold}$, when the present invention switches from a low-power state (i.e., $V_{SYSTEM}$) to high-power state (i.e., $V_{High}$), the switching of the drain voltage causes an instantaneous change (i.e., discontinuity) in the slope (gain) of the AM-AM transfer function. Normally, this would result in distortion that shows up as adjacent channel power (ACP) degradation. However, the operation of gain compensation circuit 380 (FIG. 3) compensates for the switching of the drain voltage so that gain is leveled and the effect of the AM-AM transfer function discontinuity is minimized or completely alleviated, as illustrated in FIG. 5C.

The present invention achieves improved gain compensation by implementing drain bias controller 205 (FIG. 3) as a field-programmable gate array (FPGA) operating on digital I and Q data. Since the exact timing of the high-voltage pulse duration is maintained within the FPGA, the transmitter I and Q path digital gain is adjusted using gain compensation circuit 380 and multiplier 310 during the same time period. The digital control loop circuitry used to adjust the signal level provides extremely accurate compensation for the LDMOS transistor gain changes due to modulation of the drain voltage.

In the exemplary embodiment, the exact amount of gain compensation may be pre-programmed into the FPGA using a memory or a look-up table. When RF power amplifier 140 (FIG. 2) receives the high voltage controlled by the positive pulse at output B, gain compensation circuit 380 (FIG. 3) is activated and gain is leveled so that the AM-AM transfer function discontinuity is minimized or completely alleviated.

As noted previously, delay compensation of the drain modulation circuit is also a problem in the prior art. In an exemplary embodiment of the present invention, delay element 305 (FIG. 3) in drain bias controller 205 delays the input I and Q digital data relative to the output A and B data signals. The present invention thus provides digital delay of the carrier envelope to compensate for the drain bias delays, so that the drain modulation is well aligned with the signal envelope variation. The exact amount of delay is created at very low cost, high accuracy and zero insertion loss.

Although the present invention has been described with an exemplary embodiment, various changes and modifications may be suggested to one skilled in the art by this disclosure. It is intended that the present invention encompass such changes and modifications as fall within the scope of the appended claims.

What is claimed is:

1. A radio frequency (RF) transmitter comprising:
a radio-frequency (RF) power amplifier comprising a drive transistor capable of being coupled to an antenna, wherein said RF power amplifier is capable of receiving an input RF signal and generating an output RF signal for driving said antenna; and
a drain bias adaptation circuit for supplying drain current to a drain of said drive transistor comprising:
a first switch comprising a first terminal coupled to said drive transistor drain and a second terminal coupled to a system supply voltage having a level $V_{system}$;

a second switch comprising a first terminal coupled to said drive transistor drain and a second terminal coupled to a high supply voltage having a level $V_{high}$ greater than $V_{system}$;

a first bypass capacitor coupled to said second terminal of said first switch for reducing low-frequency signal components in said drain current when said first switch is closed and said second switch is open; and a second bypass capacitor coupled to said second terminal of said second switch for reducing low-frequency signal components in said drain current when said second switch is closed and said first switch is open.

2. The radio frequency (RF) transmitter as set forth in claim 1, further comprising a control circuit for opening and closing said first and second switches, wherein said control circuit closes said first switch and opens said second switch when a detected power level, $P_D$, of a transmitter baseband signal is greater than a maximum threshold value.

3. The radio frequency (RF) transmitter as set forth in claim 2, wherein said control circuit opens said first switch and closes said second switch when said transmitter baseband signal is not greater than said maximum threshold value.

4. The radio frequency (RF) transmitter as set forth in claim 3, wherein said control circuit comprises a power detector capable of receiving digital in-phase (I) data samples and digital quadrature (Q) data samples associated with said transmitter baseband signal and calculating said detected power level, $P_D$, according to $P_D=\sqrt{I^2+Q^2}$.

5. The radio frequency (RF) transmitter as set forth in claim 4, wherein said control circuit further comprises a comparator capable of comparing said detected power level, $P_D$, to said maximum threshold value and generating a first control pulse when said detected power level, $P_D$, exceeds said maximum threshold value.

6. The radio frequency (RF) transmitter as set forth in claim 5, wherein said control circuit further comprises a pulse stretching circuit capable of receiving said first control pulse and generating a stretched control pulse having a minimum predetermined width.

7. The radio frequency (RF) transmitter as set forth in claim 6, wherein said control circuit further comprises a switch timing control circuit capable of receiving said stretched control pulse and generating a first switch control signal that opens said first switch and a second switch control signal that closes said second switch after said first switch is opened by said first switch control signal.

8. The radio frequency (RF) transmitter as set forth in claim 7, wherein said switch timing control circuit is further capable of generating a third switch control signal that opens said second switch and a fourth switch control signal that closes said first switch after said second switch is opened by said third switch control signal.

9. The radio frequency (RF) transmitter as set forth in claim 8, wherein said control circuit further comprises a gain compensation circuit capable of multiplying said transmitter baseband signal by a gain factor to thereby generate a modified baseband signal that is capable of being upconverted to produce said input RF signal to said RF power amplifier, wherein said gain factor has a first gain value when said detected power level, $P_D$, of said transmitter baseband signal is greater than said maximum threshold value and has a second gain value when said detected power level, $P_D$, of said transmitter baseband signal is not greater than said maximum threshold value.

10. The radio frequency (RF) transmitter as set forth in claim 9, wherein said control circuit further comprises a transmit path delay circuit for delaying said modified baseband signal prior to upconverting in order to compensate for time delays associated with the generation of said first, second, third and fourth switch control signals.

11. A wireless network comprising a plurality of base stations capable of communicating with mobile stations in a coverage area of said wireless network, each one of said base stations including a radio frequency (RF) transmitter comprising:

a radio-frequency (RF) power amplifier comprising a drive transistor capable of being coupled to an antenna, wherein said RF power amplifier is capable of receiving an input RF signal and generating an output RF signal for driving said antenna; and a drain bias adaptation circuit for supplying drain current to a drain of said drive transistor comprising:

a first switch comprising a first terminal coupled to said drive transistor drain and a second terminal coupled to a system supply voltage having a level $V_{system}$;

a second switch comprising a first terminal coupled to said drive transistor drain and a second terminal coupled to a high supply voltage having a level $V_{high}$ greater than $V_{system}$;

a first bypass capacitor coupled to said second terminal of said first switch for reducing low-frequency signal components in said drain current when said first switch is closed and said second switch is open; and a second bypass capacitor coupled to said second terminal of said second switch for reducing low-frequency signal components in said drain current when said second switch is closed and said first switch is open.

12. The wireless network as set forth in claim 11, further comprising a control circuit for opening and closing said first and second switches, wherein said control circuit closes said first switch and opens said second switch when a detected power level, $P_D$, of a transmitter baseband signal is greater than a maximum threshold value.

13. The wireless network as set forth in claim 12, wherein said control circuit opens said first switch and closes said second switch when said transmitter baseband signal is not greater than said maximum threshold value.

14. The wireless network as set forth in claim 13, wherein said control circuit comprises a power detector capable of receiving digital in-phase (I) data samples and digital quadrature (Q) data samples associated with said transmitter baseband signal and calculating said detected power level, $P_D$, according to $P_D=\sqrt{I^2+Q^2}$.

15. The wireless network as set forth in claim 14, wherein said control circuit further comprises a comparator capable of comparing said detected power level, $P_D$, to said maximum threshold value and generating a first control pulse when said detected power level, $P_D$, exceeds said maximum threshold value.

16. The wireless network as set forth in claim 15, wherein said control circuit further comprises a pulse stretching circuit capable of receiving said first control pulse and generating a stretched control pulse having a minimum predetermined width.

17. The wireless network as set forth in claim 16, wherein said control circuit further comprises a switch timing control circuit capable of receiving said stretched control pulse and generating a first switch control signal that opens said first switch and a second switch control signal that closes said second switch after said first switch is opened by said first switch control signal.

18. The wireless network as set forth in claim 17, wherein said switch timing control circuit is further capable of generating a third switch control signal that opens said second switch and a fourth switch control signal that closes said first switch after said second switch is opened by said third switch control signal.

19. The wireless network as set forth in claim 18, wherein said control circuit further comprises a gain compensation circuit capable of multiplying said transmitter baseband signal by a gain factor to thereby generate a modified baseband signal that is capable of being upconverted to produce said input RF signal to said RF power amplifier, wherein said gain factor has a first gain value when said detected power level, $P_D$, of said transmitter baseband signal is greater than said maximum threshold value and has a second gain value when said detected power level, $P_D$, of said transmitter baseband signal is not greater than said maximum threshold value.

20. The wireless network as set forth in claim 19, wherein said control circuit further comprises a transmit path delay circuit for delaying said modified baseband signal prior to upconverting in order to compensate for time delays associated with the generation of said first, second, third and fourth switch control signals.

\* \* \* \* \*

UNITED STATES PATENT AND TRADEMARK OFFICE
CERTIFICATE OF CORRECTION

PATENT NO.        : 7,340,228 B2
APPLICATION NO.   : 11/177032
DATED             : March 4, 2008
INVENTOR(S)       : Robert W. Monroe and Michael L. Brobston It is certified that error appears in the above-identified patent and that said Letters Patent is hereby corrected as shown below:

Column 9, claim 4, line 30, delete " $P_D \sqrt{I^2 + Q^2}$ " and replace with " $P_D = \sqrt{I^2 + Q^2}$ "

Signed and Sealed this

Fifteenth Day of December, 2009

David J. Kappos
*Director of the United States Patent and Trademark Office*